United States Patent [19]
Ishigaki et al.

[11] 4,009,455
[45] Feb. 22, 1977

[54] PHASE LOCKED LOOP ANGLE MODULATION SYSTEM WITH LARGE MODULATION INDEX

[75] Inventors: Yukinobu Ishigaki, Yamato; Kiyotake Fukui, Settsu, both of Japan

[73] Assignees: Matsushita Electric Industrial Co., Ltd., Kadoma; Victor Company of Japan, Limited, Yokohama, both of Japan

[22] Filed: Sept. 11, 1975

[21] Appl. No.: 612,297

[30] Foreign Application Priority Data

Sept. 12, 1974 Japan .......................... 49-104384
Sept. 12, 1974 Japan .......................... 49-104385
June 19, 1975 Japan ..................... 50-82671[U]

[52] U.S. Cl. ............................... 332/18; 325/148; 331/17; 331/23; 332/16 T; 332/19
[51] Int. Cl.² ........................................ H03C 3/06
[58] Field of Search ............... 332/16 R, 16 T, 18, 332/19, 30 V; 331/17, 23; 325/45, 145, 148

[56] References Cited
UNITED STATES PATENTS 3,579,281   5/1971   Kam et al. ..................... 332/30 V

OTHER PUBLICATIONS

Ostlund et al., "Center-Frequency-Stabilized Frequency Modulation System," Proceedings of the IRE, vol. 35, No. 10, Oct. 1947, pp. 1144-1149.

*Primary Examiner*—Siegfried H. Grimm

[57] ABSTRACT

An angle modulation system comprises a voltage controlled oscillator, and at least one frequency divider for dividing the frequency of the output of the voltage controlled oscillator. A phase comparator responds to the output of the frequency divider and to a reference signal supplied from a reference signal oscillator, through another frequency divider. A frequency selection circuit is provided in the path extending from the output side of the voltage controlled oscillator, through the frequency divider, to the phase comparator. This selection circuit eliminates an undesired side band component in the output of the voltage controlled oscillator and derives a required carrier component. An adder adds an input modulation signal and the output of the phase comparator, and applies the resulting signal to the voltage controlled oscillator. From the output of the voltage controlled oscillator, an angle-modulated wave signal is derived with a large signal to noise ratio and large modulation index.

6 Claims, 9 Drawing Figures

PHASE LOCKED LOOP ANGLE MODULATION SYSTEM WITH LARGE MODULATION INDEX

BACKGROUND OF THE INVENTION

The present invention relates generally to an angle modulation system, and more particularly to an angle modulation system with a large modulation index, using a phase locked loop.

An example of an angle modulation system in which a phase locked loop (hereinafter referred by the abbreviation PLL) is used, has been known in the prior art. This system comprises a voltage controlled oscillator (hereinafter referred to by the abbreviation VCO), a reference frequency oscillator, a phase comparator supplied with the output of the VCO and the reference frequency of the reference frequency oscillator, and an adder for adding the output of the phase comparator and an input modulation signal. The resulting output is supplied to the VCO. In this known system, the VCO, the phase comparator, and the adder constitute a PLL. The VCO accomplishes angle modulation in accordance with the input modulation signal. The oscillation of the VCO is controlled in accordance with the phase difference or the frequency difference between the output of the VCO and the reference frequency. As a result, an angle-modulated signal is produced as the output of the VCO.

The phase comparison limiting value of a phase comparator is, in general, $\pm \pi/2$ radians (rad.) when a phase comparator employs a multiplier, and $\pm \pi$ rad. or $\pm 2\pi$ rad. when there is a digital phase comparator. In either case, the phase comparison limiting value of the phase comparator is in the order of $\pm 2\pi$ rad., as a maximum. On the other hand, the lock range of a PLL is restricted by the phase comparison limiting value of the phase comparator. Consequently, the modulation index of the angle modulation is restricted by the phase comparison limiting value.

In this known angle modulation system, therefore, the limit of the angular deviation is $\pm 2\pi$ rad., even when a phase comparison limiting value of $\pm 2\pi$ rad. is used. As a consequence, an angle modulation having a deviation exceeding this value cannot be carried out, and a large modulation index cannot be used.

In order to overcome the above described drawbacks, the following system has been proposed. This proposed system comprises a VCO, a frequency divider for dividing to 1/N the frequency of the output signal of the VCO, a reference frequency oscillator, another frequency divider for dividing to 1/N an oscillation reference frequency of the output of the reference frequency oscillator, a phase comparator supplied with the outputs of the above mentioned two frequency dividers. An adder adds the output of the phase comparator and an input modulation signal, and, supplies the resulting output to the VCO.

When the angle-modulated signal produced by the VCO is divided to 1/N, the angle deviation is also divided to 1/N. For this reason, if the 1/N divided angle deviation is made equal to the phase comparison limiting value ($\pm \pi$ rad.) of the phase comparator, the angle deviation of the angle-modulated wave can be $\pm 2\pi \times N$ rad. That is, the maximum modulation index can be made N times that in the above first described system of the prior art.

However, when the frequency dividing ratio N, of the above mentioned frequency divider, is, made a large value to attain a desired maximum modulation index, the frequency of the input signal introduced into the phase comparator decreases by that much. If this frequency of the input signal into the phase comparator is a frequency which is within the frequency band of the modulation signal, beats will be produced at a certain frequency within the modulation signal.

SUMMARY OF THE INVENTION

Accordingly, a general object of the present invention is to provide a novel and useful angle modulation system wherein the above described difficulties are overcome.

Another and more specific object of the invention is to provide an angle modulation system using a PLL with a large modulation index, without producing beats. In the system of the invention, a frequency selection circuit eliminates an undesired side band component. This circuit appears in the path from the output of the VCO of the PLL, through the frequency divider, to the input of the phase comparator.

Still another object of the invention is to provide an angle modulation system having a large S/N ratio and a low distortion factor. In accordance with the invention, an elimination circuit removes a frequency divided carrier component in the path extending from the output of the phase comparator of the PLL to the adder, for adding that output and the input modulation signal.

A further object of the invention is to provide an angle modulation system in which, the noise signal component is effectively removed to cause good linearity and low distortion factor.

A further object of the invention is to provide an angle modulation system adapted to operate promptly after the power source is turned on.

Additional objects and further features of the invention will be apparent from the following detailed description when read in conjunction with the accompanying drawings.

DETAILED DESCRIPTION

Figure 1:
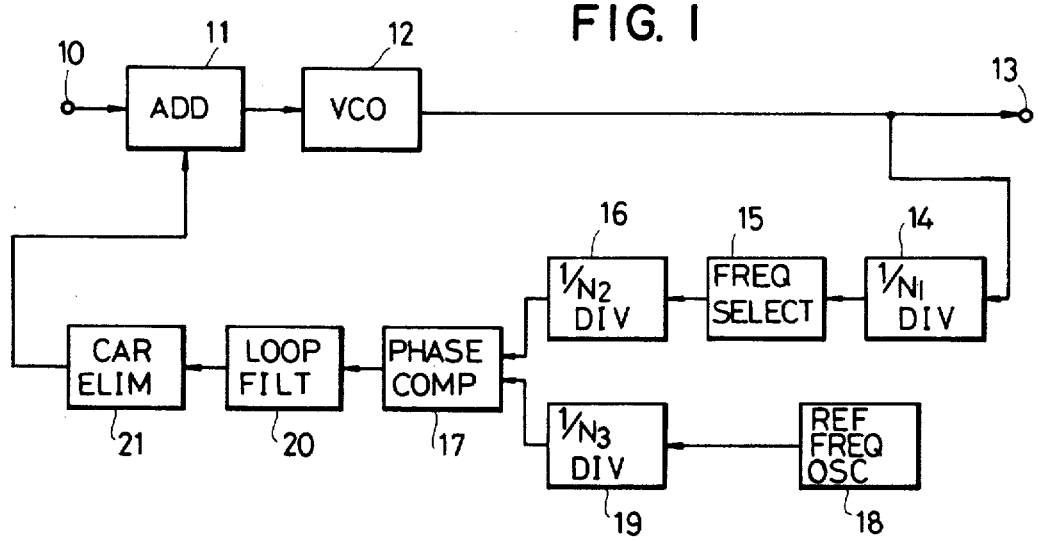
FIG. 1 is a block diagram showing one embodiment of the angle modulation system according to the invention.

In FIG. 1 an audio frequency band a modulation signal enters through an input terminal 10. It is added in an adder 11 to a signal from a frequency divided, carrier elimination circuit 21. The resulting addition output is applied to a VCO 12 to control the oscillation frequency Fo of the VCO.

The output signal of the VCO 12 is supplied to a first frequency divider 14, having a frequency division ratio N1, where its frequency is divided to 1/N1. The resulting output signal of the frequency divider 14 passes through a frequency selection circuit 15, where the undesired side band of the signal is removed. The resulting signal is thereafter fed to a second frequency divider 16 having a frequency division ratio N2, where its frequency is divided to 1/N2. The resulting output of the frequency divider 16 is supplied to a phase comparator 17.

The output reference frequency signal of a reference frequency oscillator 18 passes through a third frequency divider 19 of frequency division ratio N3, where its frequency is divided to 1/N3. Thereafter it supplied to the phase comparator 17. Here, the frequency division ratios have the relationship N3 = N1·N2.

The output of the phase comparator 17 is an error voltage in accordance with the phase difference or the frequency difference between the signals from the frequency dividers 16 and 19. This output of the phase comparator 17 passes through a loop filter 20, where the high frequency component is removed. The resulting signal further passes through the above mentioned frequency divided carrier elimination circuit 21, where its frequency divided carrier component is eliminated. It thereafter supplied to the above mentioned adder 11.

Here, a closed loop including the VCO 12 and the phase comparator 17 constitute a PLL. The VCO 12 is controlled by the output of the phase comparator 17. At the same time, it is also controlled by the modulation signal from the input terminal 10. As a consequence, the VCO 12 produces an angle-modulated output signal resulting from the modulation of a carrier, having a frequency equal to the reference frequency of the reference oscillator 18, responsive to the modulating signal introduced through the input terminal 10. This output angle-modulated signal is led out through an output terminal 13.

For the following analytical consideration, the maximum and minimum values of the frequency $f$ of the modulating signal, introduced through the input terminal 10, will be denoted by $f_{max}$ and $f_{min}$. The maximum value of the modulation index mf of angle modulation is designated by $mf_{max}$. The phase comparison limiting value will be assumed to be $\pm 2\pi$ rad. The virtual phase comparison limit of the phase comparator 17 becomes $2\pi \cdot N/N2$ rad., with respect to the output oscillation center frequency Fo of the VCO 12. Therefore, in order for the maximum value $mf_{max}$ of the modulation index not to exceed the phase modulation limiting value, the frequency ratios N1, N2, and N3 must satisfy the following relationship:

$$N3 = N1 \cdot N2 \frac{mf_{max}}{2\pi} \quad (1)$$

Furthermore, on the output side of the frequency divider 16, the center frequency of the carrier is Fo/N1·N2. The first side band of the angle-modulated wave, with respect to the modulation frequency $f$, becomes (Fo/N1·N2)$\pm f$. Therefore, when $f \approx$ Fo/N1·N2, the upper side band, becomes 2Fo/N1·N2. The frequency of this upper side band is an integral number of times greater than the frequency of the divided reference frequency. In the particular example here being described, the frequency of the upper side band (2 Fo/N1·N2) is twice the frequency of the divided reference frequency fo/N3 (= fo/N1·N2). Consequently, if the above mentioned frequency selection circuit is not provided, beats are generated in the output of the phase comparator 17. Accordingly, when the output frequency band of the frequency divider 16 is denoted by $\pm \Delta B$, the magnitude of $\Delta B$ must be held within the range:

$$\Delta B < \frac{Fo}{N1 \cdot N2} \quad (2)$$

Accordingly, in the present invention, the above Eq. (2) is satisfied. At the same time, the frequency selection circuit 15 is provided for eliminating an undesired side band component. Circuit 15 is located between the frequency dividers 14 and 16.

On the other hand, the carrier center frequency of the output of the frequency divider 14 is Fo/N1. Therefore, the first side band for the modulation frequency $f$ becomes (fo/N1)$\pm$ f. When f = 2F0/N1, the first side band becomes:

$$\frac{Fo}{N1} - f \approx -\frac{Fo}{N1},$$

and beats are produced between the frequency of this first side band and the frequency division carrier frequency of F0/N1. Therefore, the frequency division ration N1 must be such that:

$$N1 < \frac{2Fo}{f_{max}}. \quad (3)$$

where N1 is an integer greater than one (unity).

However, the frequency selection circuit 15 limits the band width of the output signal from frequency divider 14 in order to satisfy the above Eq. (2) It is necessary that at least one pair of side bands be within the output signal band even when the modulation index mf for the amplitude of the carrier component becomes zero ($mf \approx 2.4$).

That is, in terms of the maximum value $mf'_{max}$ of the modulation index at f = $\Delta B$ = Fo/N1·N2, the modulation index at the output end of the frequency divider is $mf'_{max}$/N1. Since $mf_{max}$N1 $\leq$ 2.4 must hold, the frequency division ratio N1 becomes $$N1 \geq \frac{mf_{max}}{2.4} \quad (4)$$

Therefore, from Eqs. (3) and (4), the frequency division ratio N1 becomes as follows:

$$\frac{mf'_{max}}{2.4} \leq N1 < \frac{2Fo}{f_{max}} \tag{5}$$

From the above Eqs. (1), (2), and (5), the values of the frequency division ratios N1 and N2 and frequency band width ±ΔB of the output of the frequency divider 16 are respectively determined responsive to the frequency selection circuit 15. Thus, the optimum signal is obtained as an input for the phase comparator 17.

A band-pass filter is used for the frequency selection circuit 15. This circuit has a steep filtering narrow band characteristic, as described more specifically hereinafter.

Figure 2:
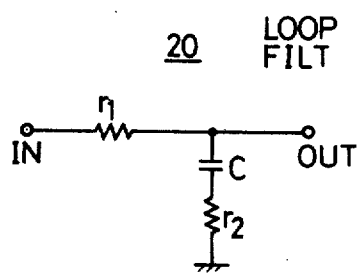
FIG. 2 is a circuit diagram of one example of a loop filter for use in the system illustrated in FIG. 1.
Figure 3:
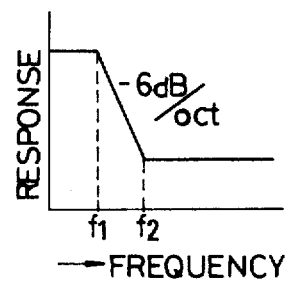
FIG. 3 is a graph indicating a characteristic of the loop filter shown in FIG. 2.

Next, the output of the phase comparator 17 is supplied to the loop filter 20, where its high-frequency component is eliminated. When a filter comprising resistors r1 and r2 and a capacitor for this loop filter 20 (FIG. 2) is used, the attenuation characteristic is as indicated in FIG. 3. The characteristic assumes a slope of −6db/oct between frequencies f1 and f2 and is flat in regions below the frequency f1 and above the frequency f2. Here:

$$f1 \simeq \frac{1}{2\pi C1(r1 + r2)} \simeq \frac{1}{2\pi C r1}$$

(where r1>>r2)

$$f2 \simeq \frac{1}{2\pi c \, r2}$$

If the loop filter 20 cannot fully attenuate the undesired component of the divided carrier component of a frequency F0/N1·N2 or an integral multiple thereof, the VCO 12 will also be controlled by this undesired component when the output of the loop filter 20 is applied directly through the adder 11 to the VCO 12. If the S/N ratio of the angle-modulated wave is small, the distortion factor is large. Particularly, the frequency of the modulating signal, introduced through the input terminal 10, is a frequency close to the frequency of the frequency divided carrier component or an integral multiple thereof. Then, a beat disturbance will be produced.

Figure 4:
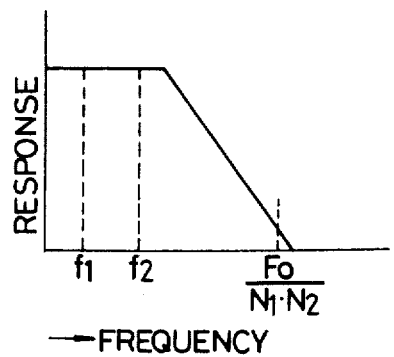
FIG. 4 is a graph indicating a characteristic of a frequency divided, carrier elimination circuit in the system shown in FIG. 1.

Accordingly, in the system of the invention, the frequency divided carrier elimination circuit 21 is provided in the loop, after the filter 20, in order to eliminate the frequency divided carrier component. The characteristic of circuit 21 is indicated in FIG. 4. Attenuation is fully accomplished with respect to the divided carrier frequency FO/N1²N2. Moreover, the characteristic has no effect on the low-frequency characteristic of the PLL. As a result of the circuit 21, the frequency divided carrier component and integral multiples thereof are effectively attenuated and eliminated, and are not supplied to the VCO 12.

Figure 5:
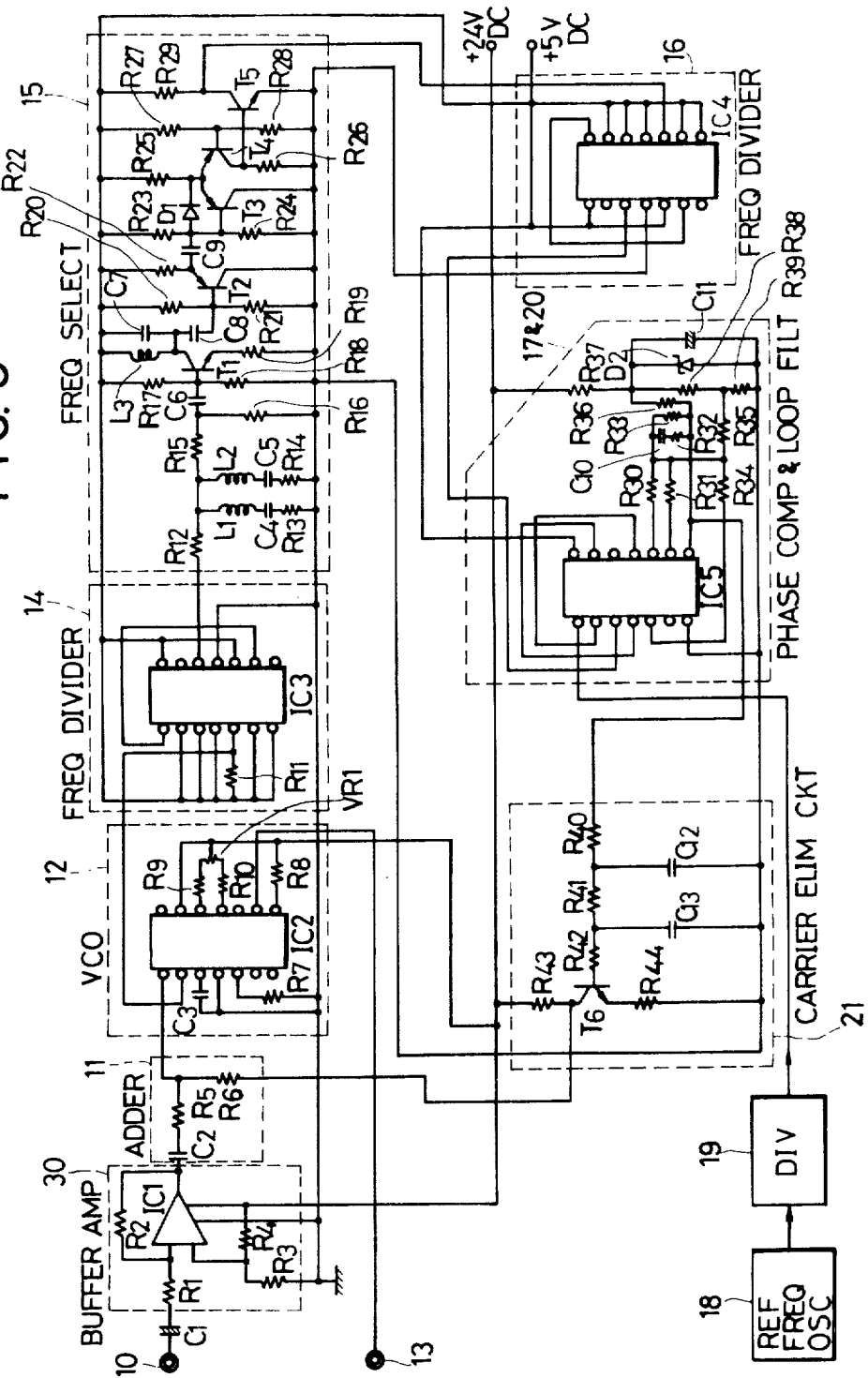
FIG. 5 is a schematic circuit diagram showing one circuit for system shown by the block diagram in FIG. 1.

One specific embodiment of an electrical circuit for use in the system indicated by the block diagram in FIG. 1 is described with reference to FIG. 5. In FIG. 5, circuit parts which are the same as the blocks shown in FIG. 1 are enclosed within dotted lines and are designated by like reference numerals.

The modulating signal enters through the input terminal 10 and is passed through a capacitor C1 to a buffer amplifier 30, comprising resistors R1 through R4 and an integrated circuit IC1 constituting an amplifier. Thereafter, it is supplied to the adder 11 comprising a capacitor C2 and resistors R5 and R6. In the adder 11, the modulating signal is added to a signal from the frequency divided carrier elimination circuit 21. The resulting signal is supplied to the VCO 12 comprising an integrated circuit IC2, resistors R7 through R10, a variable resistor VR1 and a capacitor C3, connected to control the oscillation frequency of the VCO 12.

The output signal of the VCO 12 is an output angle-modulated signal, appearing at the output terminal 13. At the same time, this output signal is supplied to the frequency divider 14 comprising an integrated circuit IC3 and a resistor R11, and is thereby frequency divided to ¼ its original value. The output signal of the frequency divider 14 is supplied to the frequency selection circuit 15 comprising resistors R12, through R29, capacitors C4 through C9, coils L1, L2, and L3, transistors T1 through T5, and a diode D1.

Figure 6:
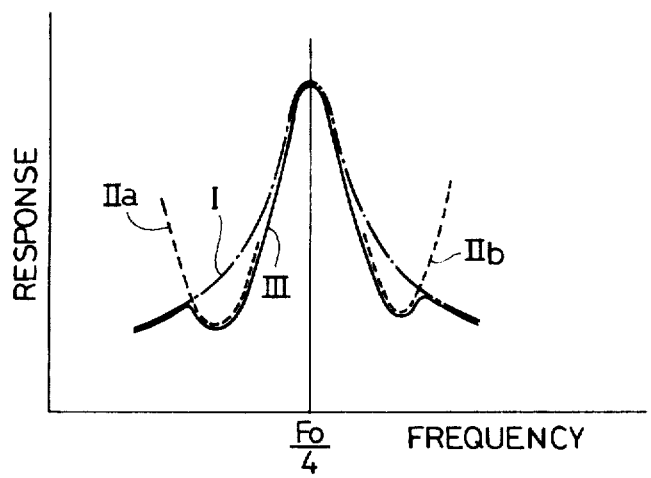
FIG. 6 is a graph indicating the selective filtering characteristics of the frequency selection circuit shown in FIG. 5.

The frequency selection circuit 15 comprises a band-pass filter circuit and an amplification and waveform shaping circuit. The band-pass filter circuit comprises a band-pass filter circuit including the resistors R15 through R19, the capacitors C6 and C7, the coil L3, and the transistor T1. The band-pass characteristic is indicated by single-dot chain line curve I in FIG. 6. Two trap circuits respectively comprise the resistors R12 and R13, the capacitor C4, and the coil L1, and the resistors R12 and R14, the capacitor C5, and the coil L2. These two circuits exhibit the attenuation characteristics as indicated by intermittent lines IIa and IIb. As its overall band-pass filtering characteristic, this circuit exhibits a characteristic as indicated by curve III in FIG. 6. The center frequency of the filtering band is Fo/4. The above mentioned waveform shaping circuit comprises the resistors R20 through R29, the capacitors C8 and C9, the transistors T2 through T5, and the diode D1. The shaping circuit amplifies the carrier level which has decreased as it passes through the band-pass filter circuit. This produces a square wave of a level which is sufficient for driving the frequency divider 16 of the succeeding stage.

The signal having the filtering characteristic of Fo/4 is frequency divided to ¼ by the frequency divider 16 after the undesired component has been eliminated by the frequency selection circuit 15. Thereafter, this signal is supplied to the phase comparator 17 and, within an integrated circuit IC5, is phase compared with a frequency division reference signal from the frequency divider 19. The loop filter comprises a DC amplifier within the integrated circuit IC5, resistors R30 through R36, and a capacitor C10 and a diode D2 are a power source for supplying power to the DC amplifier for the loop filter.

The signal which has passed through the loop filter 20 is supplied to the frequency divided carrier elimination circuit 21 of a low-pass filter circuit comprising resistors R40 through R44, capacitors C12 and C13, and a transistor T6. Circuit 21 has a cut-off characteristic of 12 dB/oct. The output signal of the frequency divided carrier elimination circuit 21 is derived from the collector of the transistor T6 and supplied to the above mentioned adder 11.

One example of the frequencies of the various signals of the angle modulation system of the invention is found in the angle modulation of a difference signal in a discrete 4-channel record disc recording system. The modulating signal entering through the input terminal is a frequency from 15 Hz to 7.5 KHz, a carrier frequency (that is, an oscillation frequency Fo of the VCO 12) of 15 Khz. The frequency divided reference signal from the frequency divider is supplied to the phase comparator. The frequency divided carrier center frequency is 937.5 Hz. The reference frequency of oscillator 18 is 15 KHz. The frequency division ratio of the frequency divider 14 and 16 is 4. The division ratio of frequency divider 19 is 16. The recording system of the above mentioned 4-channel example is a case of half-speed cutting. Recording is carried out by reducing to one-half the traveling speed of both the tape, on which is recorded an audio signal to be modulated, and the rotational disc. If reference frequency of the oscillator 18 is 3Mhz, for example, the frequency division ratio of the frequency divider 19 is set at 3200.

In general, the VCO 12 has semiconductor elements irrespective of whether it is a VCO of a multivibrator system or a VCO of a voltage frequency conversion system comprising an integrated circuit and a Schmitt trigger circuit. For this reason, within the VCO, a so-called $1/f$ noise is generated wherein the noise index increases with decrease in frequency. Here, the relationship $\Delta Fn \alpha 1/fn$ is valid, where $\Delta Fn$ is the frequency deviation due to noise voltage, and fn is the noise frequency. Therefore, the modulation index Mfn due to the noise voltage is $$Mfn \ (rad.) = \Delta Fn/fn \ \alpha \ 1/f^2n$$

From this, it is seen that the phase rotational angle (rad.) due to the noise voltage is inversely proportional to the square of the noise frequency. Consequently, the increase in the jitter becomes more extreme as the frequency becomes lower. For this reason, the jitter due to low-frequency noise is very large. Furthermore, this low-frequency noise component also has an effect on the transient response characteristic of the PLL, and the jitter is promoted even more.

Figure 7:
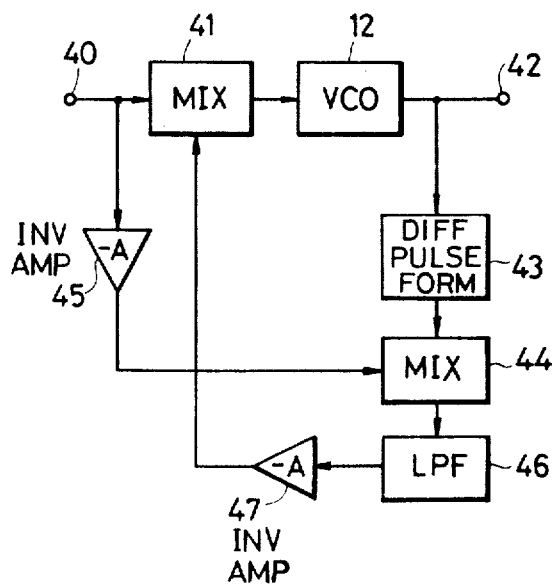
FIG. 7 is a block diagram of one embodiment of a noise elimination system relating to a voltage controlled oscillator.

Accordingly, one embodiment of a block system related to the VCO 12 in which this problem has been solved will now be described with reference to FIG. 7. A signal from the adder 11 (FIG. 1) enters this system through a terminal 40. On the one hand, it is supplied to a mixing circuit (operation circuit) 41. On the other hand, it is inverted and amplified by an inversion amplifier 45, and is supplied to a mixing circuit 44. The signal supplied from the terminal 40 to the mixing circuit 41 is there mixed with a signal from an inversion amplifier 47. The resulting signal is applied to the VCO 12 to control the oscillation frequency thereof.

The output of the VCO 12 is supplied through a terminal 42 to the output terminal 13 in FIG. 1 and to the frequency divider 14. The output of the VCO 12 is also supplied to a differentiation pulse forming circuit 43 and demodulated. Thereafter, the resulting demodulated signal is supplied to the mixing circuit 44, where it is mixed with and cancelled by the above mentioned signal from the inversion amplifier 45. As a result, only a noise signal component contained in the demodulated output of the above mentioned forming circuit 43 is derived from the mixing circuit 44.

The noise signal from the mixing circuit 44 is passed through a low-pass filter 46, where any carrier wave component remaining in this signal is completely eliminated. The output noise signal of the low-pass filter 46 is inverted and amplified by the inversion amplifier 47 and then supplied to the above mentioned mixing circuit 41. As a result, the noise signal is negatively fed back to the VCO 12. An angle-modulated wave signal from which noise has been removed and in which jitter has been amply suppressed is obtained from the VCO 12 and led out through the terminal 42.

In this connection, the loop gain of the PLL and the time constant of the loop filter 20 are so selected that the tracking frequency $\omega n$ of the PLL will be lower than the modulating signal frequency.

Then, in order to select the tracking angular frequency $\omega n$ of the loop at a value which is lower than the modulating signal frequency fm, it is necessary that the time constant of the loop filter 20 be a large value. However, when selection is made in this manner, there is a problem since there is a very long rising time (pull-in time of the loop) for the loop to become stable after the power source is turned on. However, the output signals of the frequency dividers 16 and 19 are of square waveform which contains frequency components of higher order. For this reason, if the rising time after the power source is turned on is too long, there is an erroneous locking to a frequency which is an integral multiple or a multiple of the reciprocal of an integer of the normal oscillation frequency of the VCO. This locking occurs in the pull-in (or locking) operation of the PLL. Accordingly, an embodiment of a system which is adapted to shorten the rising time after the turning on of the power source will be described below with reference to FIG. 8.

Figure 8:
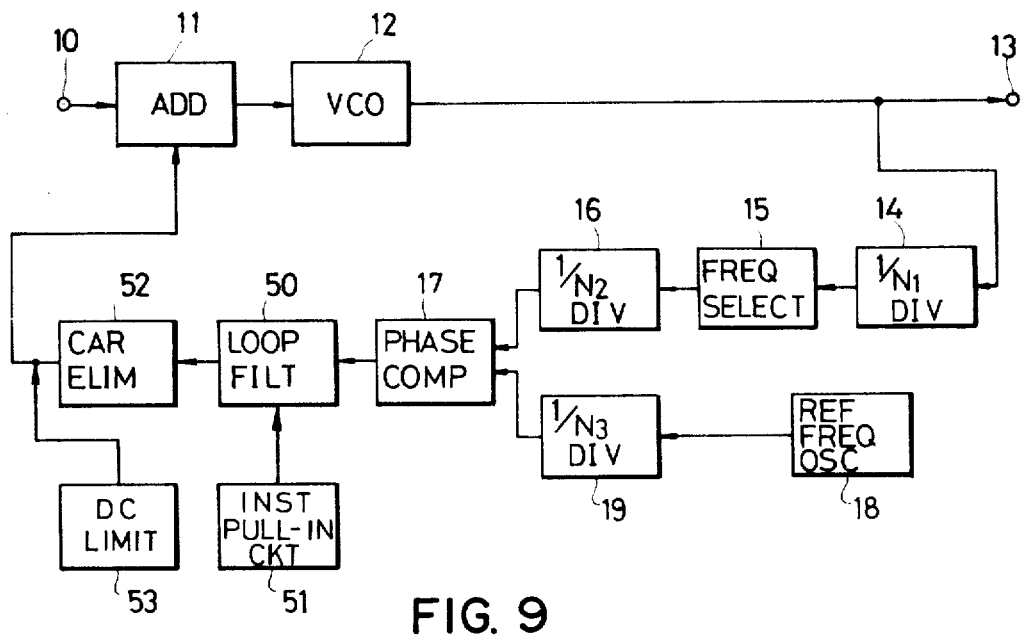
FIG. 8 is a block diagram showing a second embodiment of the angle modulation system of the invention.

FIG. 8 is a block diagram showing a second embodiment of the system according to the invention. Parts in FIG. 8 which are the same as corresponding parts in FIG. 1 are designated by like reference numerals. Detailed description of such parts will not be repeated.

Figure 9:
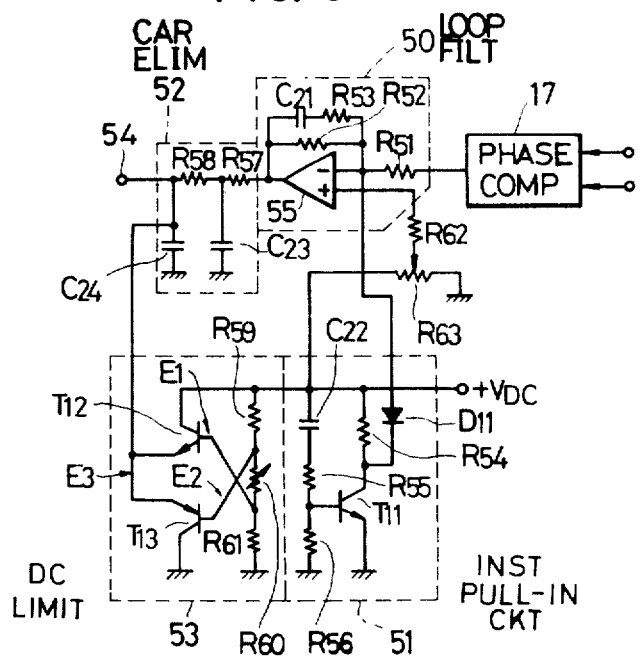
FIG. 9 is a schematic diagram showing an electrical circuit for the system shown by the block diagram in FIG. 8.

In this system second embodiment, an instantaneous pull-in (or locking) circuit 51 is provided for a loop filter 50 supplied with the output of the phase comparator 17. One specific embodiment of a circuit for this pull-in circuit 51 is shown in FIG. 9. The loop filter 50 comprises an amplifier 55, a capacitor C21, and resistors R51, R52, and R53 connected as shown in FIG. 9. The resistors R51 and R52 constitute a DC feedback loop with respect to the amplifier 55. Furthermore, the resistors R51 and R53 and the capacitor C21 constitute an AC feedback loop. The instantaneous pull-in circuit 51 comprises a transistor T11, resistors R55 and R56, a capacitor C22, and a diode D11 connected as shown in FIG. 9.

If the tracking angular frequency $\omega n$ of the PLL is a value lower than the frequency of the modulating signal, the time constant of the loop filter 50 is very large. The resistance values of the resistors R51, R52, and R53 are so set as to satisfy the relationship $R52 >> R51 > R53$. Accordingly, a time constant $\tau 1$, which becomes a factor in the determination of the time from the turning on of the power source to the synchronous pull-in of the PLL, is expressed as follows:

$$\tau 1 \simeq (1 + \frac{R52}{R51})R51 \ C21$$

This time constant $\tau 1$ has the relationship $\tau 1 >> 2$ to a time constant $\tau 2$ determined by the capacitor C21 and the resistor R53.

On the one hand, a time constant $\tau 3$ is determined by the capacitor C22 and the resistors R55 and R56 of the instantaneous pull-in circuit 51. This constant is set at a value equal to or slightly larger than the time constant τ2. When the power source is turned on, a differentiated pulse is applied to the base of the transistor T11 for a very short time determined by the time constant τ3, whereupon the transistor T11 is switched "ON," and, simultaneously, the diode D11 also becomes "ON."

Consequently, the DC feedback loop and the AC feedback loop of the loop filter 50 are grounded (earthed). The capacitor C21 is charged with the time constant τ2. Therefore, since there is the relationship τ1 >> τ2, the loop filter 50 instantaneously pulls in. The output of this loop filter 50 is supplied to a filter circuit 52 for carrier elimination which comprises resistors R57 and R58 and capacitors C23 and C24.

The DC limiter 53 is connected to this carrier elimination filter circuit 52. This limiter 53 comprises resistors R59, R60, and R61 and transistors T12 and T13. In terms of the base potential E1 of the transistor T12, the potential $V_{BE2}$ is between the base and emitter of the transistor T12. The base potential E2 of the transistor Q3, and the potential $V_{BE3}$ is between the base and emitter of the transistor. A Q3 DC potential E3 appears on a terminal 54. The condition for the transistor T12 to switch "ON" is represented by $(E1 - V_{BE2}) \geq E3$, and the condition for the transistor T13 to switch "ON" is represented by $(E2 + V_{BE3}) \leq E3$.

Upon the elapse of a time period determined by the time constant τ3 after the power source is turned on, the input differentiation pulse disappears. As a consequence, the transistor T11 switches "OFF"; the diode D11, is reversely biased and switches, "OFF"; and the transistors T12 and T13 also switch "OFF." At this time, the above mentioned DC potential E3 becomes stable. The time up to the instant when this potential E3 becomes stable is compulsorily set within the range indicated by the following equation by the DC limiter 53.

$$E1 - V_{BE2} < E3 < (E2 + V_{BE3})$$

In the instant embodiment, the above mentioned DC potentials $(E1 - V_{BE2})$ and $(E2 + V_{BE3})$ can be set at will by means of the variable resistor R60 so as to prevent the center frequency Fo of the VCO 12 from becoming greater than twice or less than ½ of a specific value.

As a result, from the instant immediately after the power source is turned on, the DC potential E3 is supplied with the range of the above equation from the DC limiter 53 through the terminal 54 to an amplifier of the circuit of the succeeding stage. For this reason, the VCO 12 oscillates for an instantaneous time within a specific frequency range. Simultaneously, after the elapse of a very short time period determined by the time constant τ2 of the instantaneous pull-in circuit 51, loop pull-in is carried out by the loop filter 50. As a consequence, after the power source is turned on, the center frequency of the output angle-modulated wave signal of the VCO 12 is instantaneously locked to the reference signal frequency.

When the PLL starts its normal operation, all of the transistors T11, T12, and T13 switch "OFF". The instantaneous pull-in circuit 51 and the DC limiter 53 become unrelated to the operation of the angle modulation circuit.

In the above described circuit, a resistor R62 and a variable resistor R63 are provided for the purpose of setting the bias potential of the VCO 12.

Further, this invention is not limited to these embodiments. Many variations and modifications may be made without departing from the scope and spirit of the invention.

What is claimed is:

1. An angle modulation system comprising:
   means for supplying a modulating signal;
   a voltage controlled oscillator means operating at an oscillation frequency controlled by an applied signal, said voltage controlled oscillator naturally having an undesired side band:
   frequency dividing means for dividing the output frequency of the voltage controlled oscillator with a specific frequency dividing ratio;
   means for supplying a reference signal of a specific frequency;
   phase comparison means jointly responsive to the output of the frequency dividing means and the reference signal from the reference signal supplying means;
   frequency selection means in a path extending from the voltage controlled oscillator means, through the frequency dividing means, to the phase comparison means, said frequency selection means eliminating said undesired side band component from the output of the voltage controlled oscillator means;
   adding means for adding the modulating signal and the output signal of the phase comparison means, and for applying the resulting signal to the voltage controlled oscillator means;
   carrier elimination means in a path extending from the phase comparison means to the adding means for eliminating a frequency divided carrier component; and
   means for deriving an angle-modulated signal from the output of the voltage controlled oscillator.

2. An angle modulation system as claimed in claim 1 in which said frequency selection means comprises a band-pass filter circuit and an amplifying and waveform shaping circuit.

3. An angle modulation system as claimed in claim 1 in which said frequency dividing means comprises a first frequency divider means for dividing the output of the voltage controlled oscillator with a first frequency dividing ratio, and a second frequency divider means for dividing the output of the first frequency divider with a second frequency dividing ratio, said frequency selection means being coupled between the first and second frequency dividers, said reference signal supplying means comprises a reference oscillator means for producing a reference frequency, and a third frequency divider means for dividing the reference frequency into a frequency which is substantially equal to the output signal of the second frequency dividing means.

4. An angle modulation system comprising:
   means for supplying a modulating signal;
   a voltage controlled oscillator means for generating an output frequency controlled by an applied signal, said oscillator output naturally containing an unwanted side band component;
   a first frequency divider means for dividing the output of the voltage controlled oscillator with a first frequency dividing ratio;
   frequency selection means for eliminating said undesired side band component from the output of the first frequency divider;

a second frequency divider means for dividing the output of the frequency selection means with a second frequency dividing ratio;

a reference oscillator means for producing a reference frequency;

a third frequency divider means for dividing the output reference frequency into a frequency which is substantially equal to the output signal of the second frequency divider;

phase comparison means supplied with the output of the second frequency divider means and the output of the third frequency divider means;

a loop filter means for eliminating a high frequency component in the output of the phase comparison means;

carrier elimination means for eliminating a frequency divided carrier component in the output of the loop filter;

adding means for adding the modulating signal and the output signal for the carrier elimination means, and for applying the resulting signal to the voltage controlled oscillator; and means for deriving an angle-modulated signal from the output of the voltage controlled oscillator.

5. An angle modulation system comprising:

means for supplying a modulating signal;

a voltage controlled oscillator means operating at an output frequency which is controlled by an applied signal, said output naturally including a side band which is undesired in the angle modulation system;

frequency dividing means for dividing the output frequency of the voltage controlled oscillator with a specific frequency dividing ratio;

means for supplying a reference signal of a specific frequency;

phase comparison means responsive to the output of the frequency dividing means and the reference signal from the reference signal supplying means;

frequency selection means in a path extending from the voltage controlled oscillator means, through the frequency dividing means, to the phase comparison means, said frequency selection means eliminating said undesired side band component in the output of the voltage controlled oscillator;

adding means for adding the modulating signal and the output signal of the phase comparison means, and for applying the resulting signal to the voltage controlled oscillator;

means for deriving an angle-modulating signal from the output of the voltage controlled oscillator means;

means for demodulating an angle-modulated wave signal from the voltage controlled oscillator means;

means for inverting the polarity of an input signal supplied to the voltage controlled oscillator means and for mixing the same with the output of the demodulation means and deriving a noise signal component; and means for inverting the polarity of the derived noise signal component, mixing the same with the output of the adding means and applying the resulting signal to the voltage controlled oscillator.

6. An angle modulation system comprising:

means for supplying a modulating signal;

a voltage controlled oscillator means for generating an output frequency controlled by an applied signal, said output signals including an undesired frequency band;

frequency dividing means for dividing the output frequency of the voltage controlled oscillator with a specific frequency dividing ratio;

means for supplying a reference signal of a specific frequency;

phase comparison means responsive to the output of the frequency dividing means and the reference signal from the reference signal supplying means;

frequency selection means in a path extending from the voltage controlled oscillator means, through the frequency dividing means, to the phase comparison means, said frequency selection means eliminating said undesired frequency band from the output of the voltage controlled oscillator;

adding means for adding the modulating signal and the output signal of the phase comparison means, and for applying the resulting signal to the voltage controlled oscillator;

means for deriving an angle-modulated signal from the output of the voltage controlled oscillator means;

a loop filter means in a path extending from the phase comparison means to the adding means for eliminating a high frequency component in the output of the phase comparison means, said loop filter means comprising an amplifier and a feedback loop for the amplifier, said loop filter means having a relatively large time constant determined by said feedback loop; a phase locked loop including the voltage controlled oscillator means, the frequency dividing means, the frequency selection means, the phase comparison means, and the adding means;

means for grounding the feedback loop in the loop filter means during a short time period after power is turned on; and DC limiting means for producing a DC voltage during at least the time period after the power is turned on and before the instant when the phase locked loop is pulled into synchronism, said DC limiting means being in a path extending from the phase comparator, and through the loop filter, to the adding means.

* * * * *